(12) United States Patent
Lewellen et al.

(10) Patent No.: US 7,573,053 B2
(45) Date of Patent: Aug. 11, 2009

(54) POLARIZED PULSED FRONT-END BEAM SOURCE FOR ELECTRON MICROSCOPE

(75) Inventors: John W. Lewellen, Willowbrook, IL (US); John Noonan, Naperville, IL (US)

(73) Assignee: UChicago Argonne, LLC, Chicago, IL (US)

( * ) Notice: Subject to any disclaimer, the term of this patent is extended or adjusted under 35 U.S.C. 154(b) by 341 days.

(21) Appl. No.: 11/625,454

(22) Filed: Jan. 22, 2007

(65) Prior Publication Data

US 2007/0228286 A1  Oct. 4, 2007

Related U.S. Application Data

(60) Provisional application No. 60/787,560, filed on Mar. 30, 2006.

(51) Int. Cl.
*H01J 37/73* (2006.01)
(52) U.S. Cl. ............. 250/493.1; 250/306; 250/307; 250/310; 250/311; 250/400; 313/542; 313/544
(58) Field of Classification Search ...... 250/396 R–396 ML, 491.1, 492.2, 492.24, 493.1, 505.1, 398, 250/399, 400, 306, 307, 310, 311; 313/542, 313/544
See application file for complete search history.

(56) References Cited

U.S. PATENT DOCUMENTS

| | | | | |
|---|---|---|---|---|
| 3,968,376 A | * | 7/1976 | Pierce et al. | 250/493.1 |
| 4,460,831 A | * | 7/1984 | Oettinger et al. | 250/492.2 |
| 4,871,251 A | * | 10/1989 | Preikschat et al. | 356/336 |
| 5,041,724 A | * | 8/1991 | Feuerbaum et al. | 250/307 |
| 5,266,809 A | * | 11/1993 | Engel | 250/397 |
| 5,932,966 A | * | 8/1999 | Schneider et al. | 313/542 |
| 6,495,002 B1 | * | 12/2002 | Klepper et al. | 204/192.38 |
| 2004/0061456 A1 | * | 4/2004 | Yu et al. | 315/505 |
| 2006/0033417 A1 | * | 2/2006 | Srinivasan-Rao et al. | 313/399 |

FOREIGN PATENT DOCUMENTS

JP  10269976 A  * 10/1998

* cited by examiner

*Primary Examiner*—David A Vanore
*Assistant Examiner*—Michael J Logie
(74) *Attorney, Agent, or Firm*—Joan Pennington

(57) ABSTRACT

A method and an electron source are provided for generating polarized electrons for an electron microscope. The electron source includes a photoemissive cathode and a low-power drive laser. The geometry of the photoemissive cathode uses a generally planar emission surface, which is imaged to approximately 1/100 its initial size via electrostatic focusing elements. The virtual emitter, or image spot, then is used as an electron source by a conventional microscope column.

19 Claims, 3 Drawing Sheets

POLARIZED PULSED FRONT-END BEAM SOURCE FOR ELECTRON MICROSCOPE

This application claims the benefit of U.S. Provisional Application No. 60/787,560, filed on Mar. 30, 2006.

CONTRACTUAL ORIGIN OF THE INVENTION

The United States Government has rights in this invention pursuant to Contract No. W-31-109-ENG-38 between the United States Government and The University of Chicago and/or pursuant to Contract No. DE-AC02-06CH11357 between the United States Government and UChicago Argonne, LLC representing Argonne National Laboratory.

FIELD OF THE INVENTION

The present invention relates to microscopy applications, and more particularly to a novel electron source for microscopy applications including electron microscopes.

DESCRIPTION OF THE RELATED ART

Electron microscopes require an electron source of some form. The electron source is typically either a hot cathode, such as a tungsten dispenser or $LaB_6$, or a field emission needle cathode, for example, fine tungsten tip.

In either case the electrons are emitted from the source with random polarization, or spin orientation. The electrons being randomly polarized causes inefficient and ineffective probing of some magnetic phenomena.

Currently chopping the electron beam current must be performed either mechanically, or by varying the settings of the microscope's power supply.

A need exists for an improved mechanism to accommodate these limitations of conventional microscopes.

Principal aspects of the present invention are to provide an electron source for electron microscopes that is capable of delivering polarized electrons, and that enables improved performance. Other important aspects of the present invention are to provide such an electron source for electron microscopes substantially without negative effect and that overcome many of the disadvantages of prior art arrangements.

SUMMARY OF THE INVENTION

In brief, a method and an electron source are provided for generating polarized electrons for an electron microscope. The electron source includes a photoemissive cathode and a low-power drive laser.

In accordance with features of the invention, the geometry of the photoemissive cathode uses a generally planar emission surface, which is imaged, for example, to approximately $1/100$ its initial size via electrostatic focusing elements. The virtual emitter, or image spot, then is used as an electron source by a conventional microscope column.

In accordance with features of the invention, by using a cathode made of gallium arsenide (GaAs) with suitable cessation of the surface, and with suitable laser light, the electrons emerge from the surface with a well-defined polarization, or spin orientation. This permits the microscope to be used to probe phenomena such as domains and domain boundaries in magnetic materials more easily than current techniques depending on post-emission sorting of the electron polarization.

In accordance with features of the invention, the use of an external laser to drive electron emission provides advantages over a conventional source where changing the beam current requires changing the emission current density on the cathode; in turn, this impacts the focusing optics along the column. With an external drive laser of the invention the current is varied without varying the emission current density simply by using a resized laser spot with proportionally scaled laser power. Since the focusing is sensitive primarily to current density, this technique allows changes in the beam current without requiring changes to the column focusing optics.

In accordance with features of the invention, gating the drive laser enables cathode emission current gating at arbitrary rates, providing improved performance over prior art arrangements.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the preferred embodiments, a method and an electron source are provided for generating polarized electrons for an electron microscope. The electron source is designed to replace the electron emitter in existing electron microscopes. An electron beam emitted from a photocathode-planar electron source is focused to a point source that is comparable to a thermionic or field emission cathode at the source location in the microscope column. The electrons are accelerated and focused in the existing microscope column.

In accordance with features of the invention, the polarization source assembly advantageously is designed to replace the electron emitter in existing electron microscopes. The electron beam emitted from a photocathode planar electron source is focused to a point source that is comparable to a thermionic or field emission cathode at the source location in the microscope column. The electrons are accelerated and focused in the existing microscope column.

Figure 1:
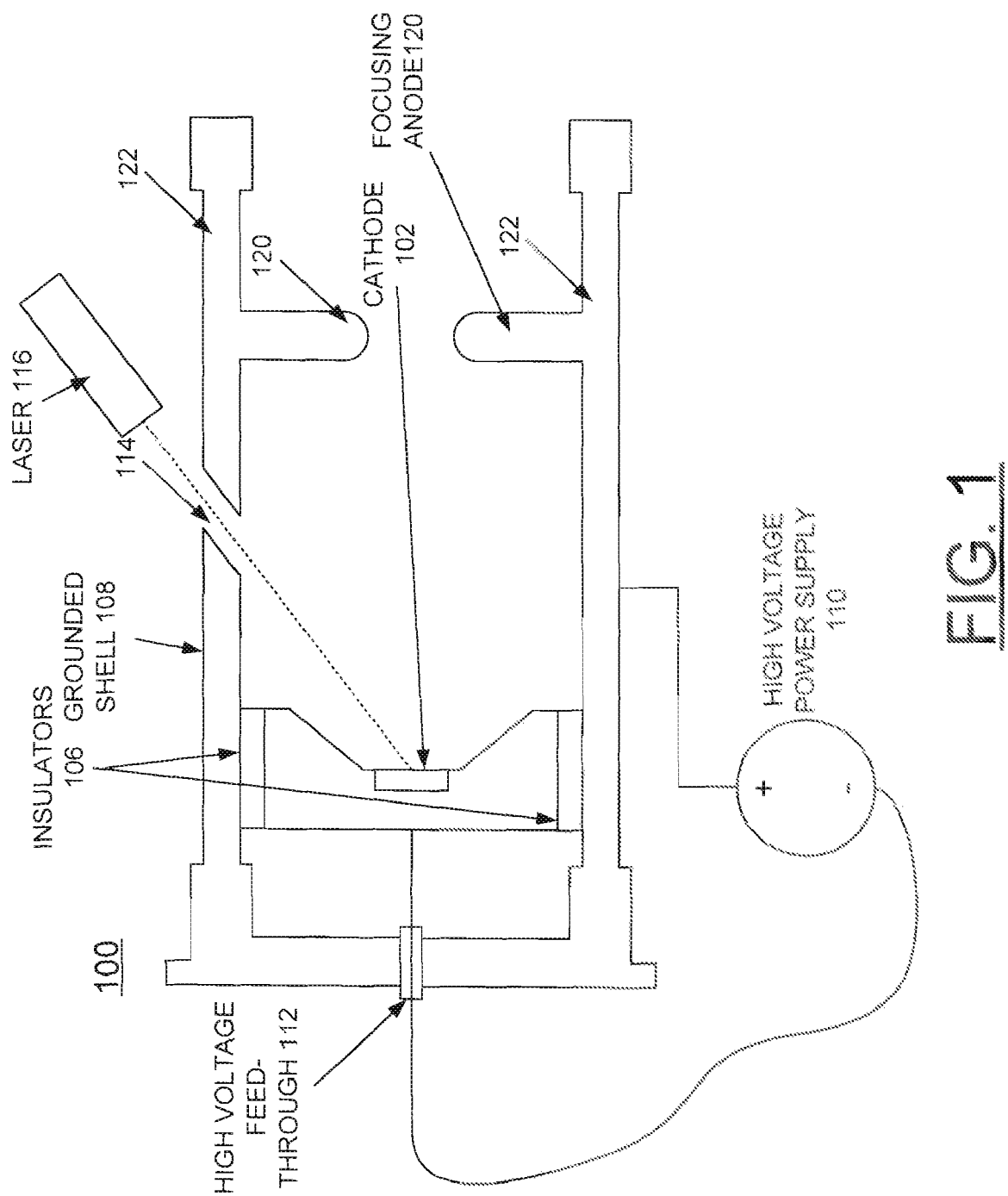
FIG. 1 is a schematic and block diagram illustrating an exemplary electron source for an electron microscope in accordance with a preferred embodiment.

Having reference now to the drawings, in FIG. 1 there is shown an exemplary electron source generally designated by the reference character 100 for use with an associated electron microscope (not shown) in accordance with the preferred embodiment.

Electron source 100 includes a cathode 102 supported by a cathode holder 104. A set of insulators 106 within a grounded shell 108 mounts the cathode holder 104. Electron source 100 includes a high voltage power supply 110 providing a high voltage potential to the cathode 102 via the cathode holder 104.

A high voltage feed-through 112 extending through the grounded shell 108 couples the high voltage potential to the cathode 102. A laser port 114 defined within the grounded shell 108 provides a laser light path from a laser 116 to the cathode 102.

A commercially available EMCO DX250N power supply manufactured and sold by EMCO having a Web site www.emcohighvoltage.com, can be used for the high voltage power supply 110. A commercially available example for implementing laser 116 is an NT56-485 solid-state 532 nm 10 mW laser sold by Edmund Optics, having a Web site www.edmundoptics.com.

A focusing anode disc 120 is installed in the grounded shell 108 and strategically spaced from the cathode 102 to provide the required focusing. Variable gap length between the cathode 102 and the anode 120 allows broad tuning.

The cathode 102 is made, for example, of gallium arsenide (GaAs) with suitable cessation of the surface, and with a suitable laser light, the electrons emerge from the surface with a well-defined polarization, or spin orientation. This permits the associated electron microscope (not shown) to be used to probe phenomena such as domains and domain boundaries in magnetic materials more easily than current techniques depending on post-emission sorting of the electron polarization.

In accordance with features of the preferred embodiments, several additional advantages can be gained by the use of the external laser 116 to drive electron emission. In a conventional source, changing the beam current requires changing the emission current density on the cathode; in turn, this impacts the focusing optics along the column. With the external drive laser 116, however, the current can be increased without increasing the emission current density simply by using a larger laser spot with proportionally higher laser power. Since the focusing is sensitive, to an extent depending on the beam current, primarily to current density, this technique will allow large changes to the beam current without requiring changes to the column focusing optics, resulting in more efficient uses of time.

In accordance with features of the preferred embodiments, the cathode emission current advantageously is gated at arbitrary rates by gating the drive laser 116. This allows both easy on and off control without requiring any change to the microscope power supplies, but also gating of the current up to extremely high rates. This would allow the use of standard lock-in techniques, for instance, at rates comparable to the x-ray pulse timing at storage-ring facilities. This is a capability, which cannot be matched via mechanical means (for instance, via a chopper wheel placed in the beam current) compatible with conventional microscope designs.

Figure 2:
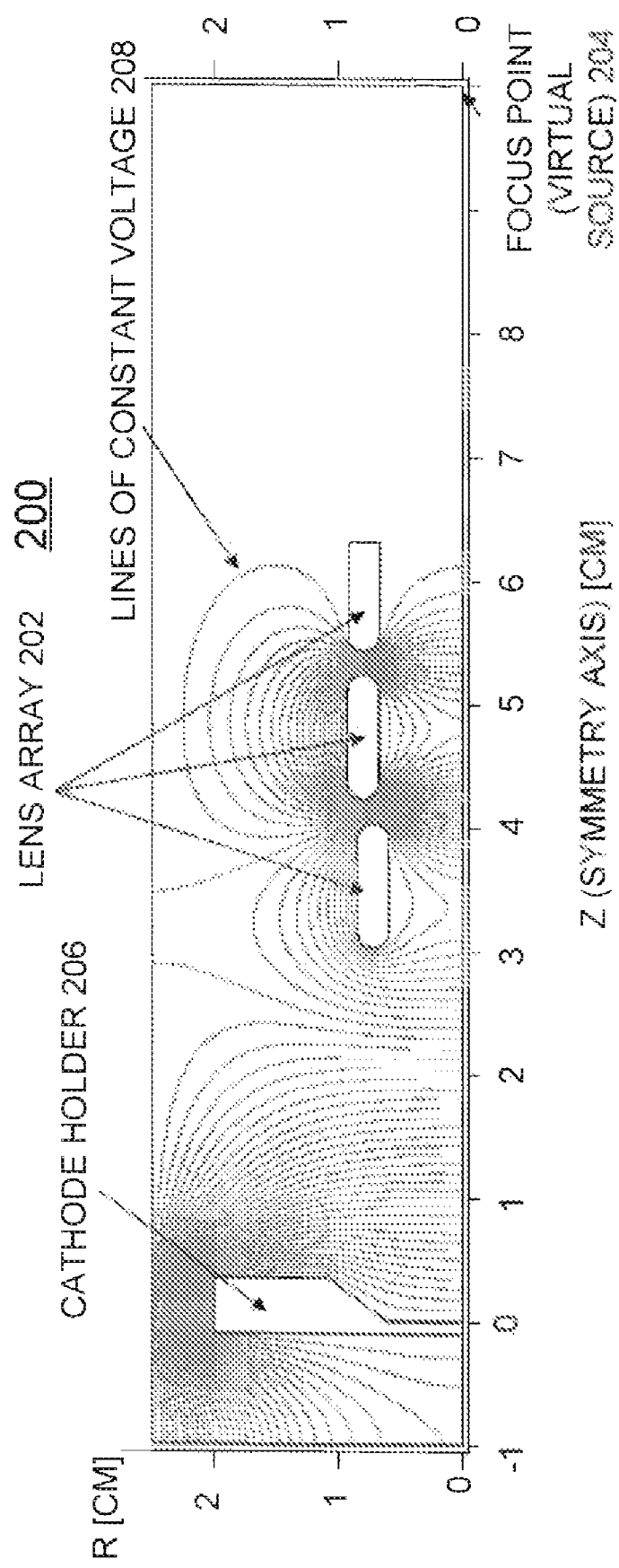
FIG. 2 is a schematic diagram illustrating another exemplary electron source for an electron microscope with lines of constant voltage for an exemplary lens array in accordance with a preferred embodiment.

Referring also to FIG. 2, there are shown another exemplary electron source generally designated by the reference character 200 in accordance with a preferred embodiment for an associated electron microscope (not shown). Electron source 200 includes similar components as electron source 100 except that the single lens anode 120 in FIG. 1 is replaced by a multiple lens array 202 for focusing the polarized and/or pulsed electrons in accordance with a preferred embodiment. A focus point 204 is shown along a Z symmetry axis spaced from a cathode holder 206. Exemplary lines of constant voltage generally designated by the reference character 208 are shown with the exemplary lens array 202.

Figure 4:
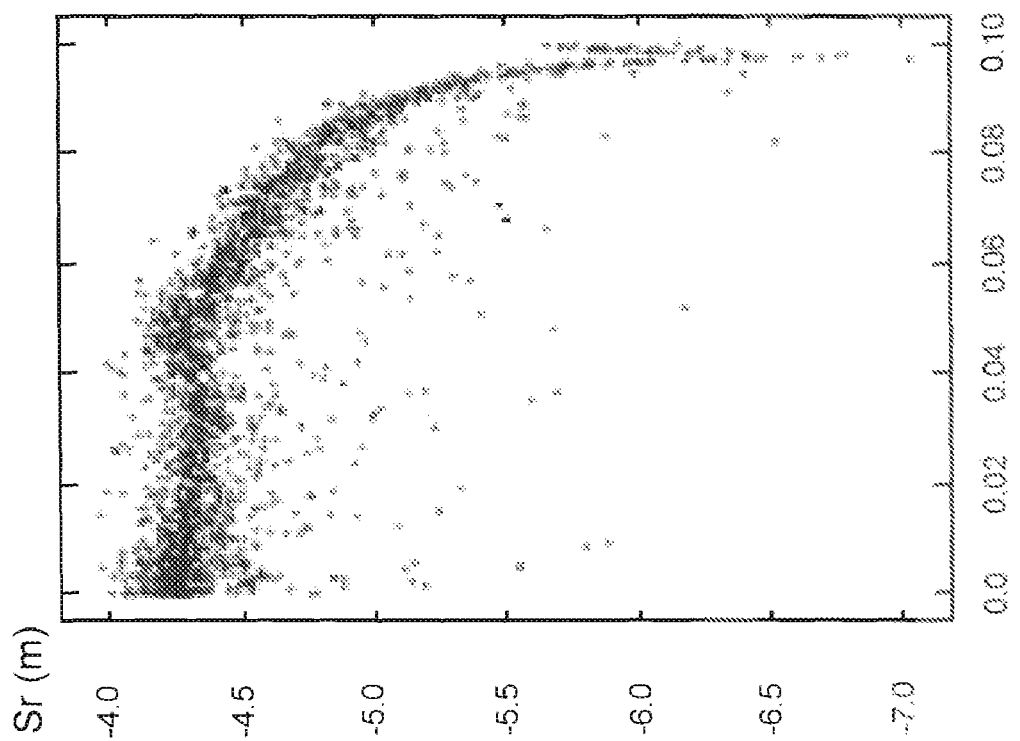
FIGS. 3 and 4 are charts illustrating exemplary operation of an electron source in accordance with a preferred embodiment.
Figure 3:
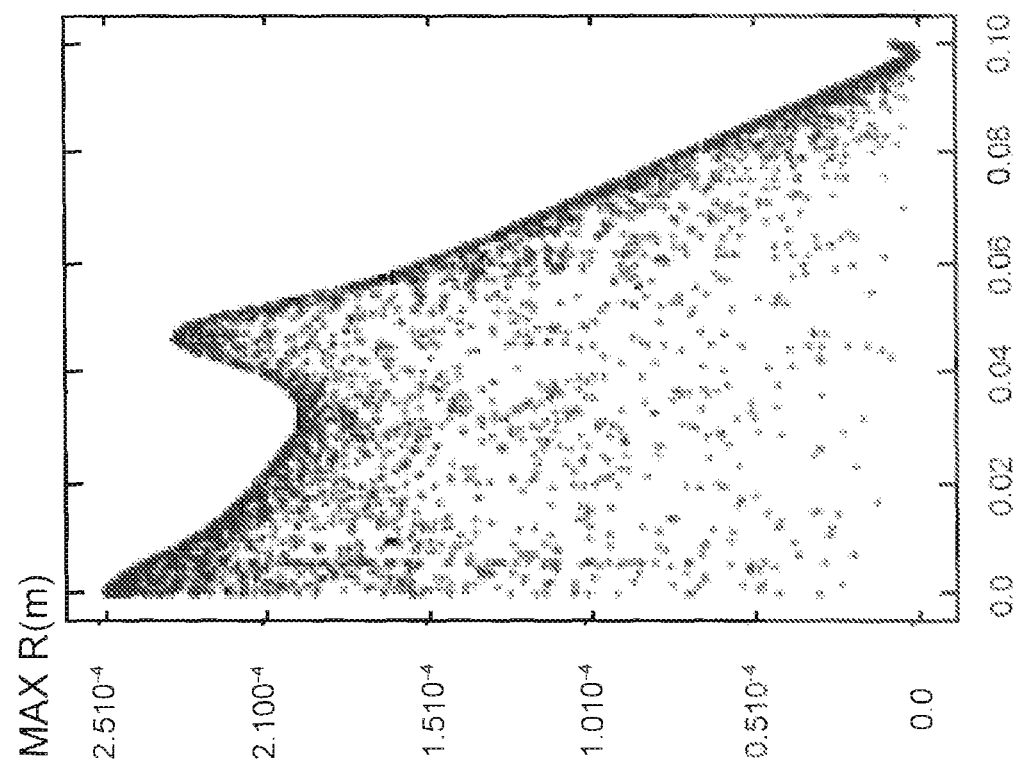

Referring also to FIGS. 3 and 4, exemplary operation of an electron source 100 is shown in accordance with a preferred embodiment. Two key parameters for an electron beam are the average radius, or spot size, and the maximum radius of the beam, or envelope.

To calculate both the spot size and the envelope for a beam, as a function of position along the axis of the beam, first one specifies a narrow slice of distance along the beam; say from 1 cm to 1.01 cm. Then, one takes all particles within that slice and calculates their average position (which should be around 1.005 cm), and the average radius. The one particle furthest from the axis defines the envelope for that slice. Zmean (m) is the slice's average position in meters; MaxR is the slice's envelope in meters, and Sr (or sigma radius) is the slice's spot size in meters.

In FIG. 3, the maximum radius of a sample of electrons in the electron beam, commonly referred to as the beam envelope, in units of meters, MaxR (m) is shown along the vertical axis relative to Zmean (m), the average position of the sample along the axis, in meters, shown along the horizontal axis. In FIG. 4, the root-mean-square radius of a sample of electrons in the electron beam (commonly referred to as the "spot size"), in units of meters, Sr (m) is shown along the vertical axis relative to Zmean (m), the average position of the sample along the axis, in meters, shown along the horizontal axis. In FIG. 4, the base-10 logarithm of Sr: log (Sr) is plotted on the vertical axis, because this better shows just how small the spot size gets; if you look around Zmean=0.095, log(Sr) is less than −6.0; or, Sr is less than $10^{-6}$ m, or 1 μm. This is a very small spot size indeed for a microscope source.

The linear scale used on FIG. 3 cannot provide that information nearly as well, but does a better job showing the variations in the envelope as the beam moves through the lenses, where ripples that are clear in FIG. 3 are barely visible in FIG. 4.

In brief summary, potential uses of the electron source 100 are widespread in both government and industry, as it offers two new methods of extending the performance of a widely used analytical tool, the electron microscope. Electron source 100 fulfills a need for generating polarized electron beams to more readily probe magnetic phenomena at the nanoscale. Electron source 100 has the advantage that the electrons are generated in a polarized state, minimizing the need for post-analysis and sorting of the electrons. Electron source 100 fulfills a need for rapidly and efficiently modulating the current of an electron microscope so as to be more readily used with other analytical tools, for example, RF systems, storage ring x-rays, and the like. Electron source 100 has the advantage that the modulation is performed external to the microscope itself, and can be done at extremely high rates.

A relatively simple mechanical system of cylindrical electrostatic lenses, two high-voltage power supplies, and a simple thermionic-type cathode can be used to proof the initial focusing concept. A GaAs cathode and small, low-power drive laser are required to demonstrate photocathode emission. A small mechanical laser chopper wheel or electro-optic modulator can be used to demonstrate pulsed emission control.

While the present invention has been described with reference to the details of the embodiments of the invention shown in the drawing, these details are not intended to limit the scope of the invention as claimed in the appended claims.

What is claimed is:

1. An electron source for generating polarized electrons for an electron microscope comprising:
   a photoemissive cathode; said photoemissive cathode made of gallium arsenide (GaAs);
   a low-power drive laser providing a pulsed laser beam to said photoemissive cathode; said low-power drive laser providing a resized laser snot with proportionally scaled laser power and said resized laser snot changing beam current;
   said photoemissive cathode generating pulsed, polarized electrons responsive to said pulsed laser beam; and electrostatic focusing elements for focusing said pulsed, polarized electrons to approximately 1/100 of an initial spot size from said photoemissive cathode to an image spot, said image spot providing the electron source for a microscope column.

2. An electron source for generating polarized electrons as recited in claim 1 wherein said photoemissive cathode has a generally planar emission surface.

3. An electron source for generating polarized electrons as recited in claim 1 wherein said photoemissive cathode made of gallium arsenide (GaAs) has a generally planar emission surface providing pulsed, polarized electrons having a defined spin orientation.

4. An electron source for generating polarized electrons as recited in claim 1 wherein said photoemissive cathode made of gallium arsenide (GaAs) includes predefined cesiation of a generally planar emission surface of said photoemissive cathode, and said applied pulsed laser beam producing electrons emerging from the surface with a defined polarization or spin orientation.

5. An electron source for generating polarized electrons as recited in claim 1 includes a cathode holder supporting said photoemissive cathode.

6. An electron source for generating polarized electrons as recited in claim 5 includes a grounded shell containing said photoemissive cathode; a set of insulators coupled between said grounded shell and said cathode holder supporting and positioning said photoemissive cathode holder.

7. An electron source for generating polarized electrons as recited in claim 6 includes a high voltage power supply providing a high voltage potential to said photoemissive cathode.

8. An electron source for generating polarized electrons as recited in claim 7 includes a high voltage feed-through extending through said grounded shell coupling the high voltage potential to said photoemissive cathode.

9. An electron source for generating polarized electrons as recited in claim 6 includes a focusing anode extending from said grounded shell and spaced from said photoemissive cathode; a variable gap length selectively defined between said photoemissive cathode and said focusing anode allowing broad focusing tuning.

10. An electron source for generating polarized electrons as recited in claim 6 wherein said low-power drive laser is provided external to said grounded shell; said low-power drive laser being gated at a selected rate for gating a cathode emission current.

11. An electron source for generating polarized electrons as recited in claim 6 includes said low-power drive laser being positioned relative to said photoemissive cathode, and a laser port defined within said grounded shell providing a laser light path from said low-power drive laser to said photoemissive cathode.

12. A method for generating polarized electrons for an electron microscope comprising the steps of:
providing an external electron source using a photoemissive cathode and a low-power drive laser for providing a pulsed laser beam to said photoemissive cathode; said photoemissive cathode made of gallium arsenide (GaAs);
generating pulsed, polarized electrons from said photoemissive cathode responsive to applying said pulsed laser beam; providing a resized laser spot with proportionally scaled laser rower applied to said low-power drive laser and said resized laser spot changing beam current and
focusing said pulsed, polarized electrons to approximately 1/100 of an initial spot size from said photoemissive cathode to an image spot, said image spot providing the electron source for a microscope column.

13. A method for generating polarized electrons for an electron microscope as recited in claim 12 wherein providing said external electron source using said photoemissive cathode and said low-power drive laser includes providing said photoemissive cathode having a generally planar emission surface.

14. A method for generating polarized electrons for an electron microscope as recited in claim 12 wherein providing said external electron source using said photoemissive cathode and said low-power drive laser includes providing said photoemissive cathode made of gallium arsenide (GaAs) having a generally planar emission surface providing pulsed, polarized electrons having a defined spin orientation.

15. A method for generating polarized electrons for an electron microscope as recited in claim 12 wherein providing said external electron source using said photoemissive cathode and said low-power drive laser includes providing a cathode holder supporting said photoemissive cathode; and gating said low-power drive laser at a selected rate for gating a cathode emission current.

16. A method for generating polarized electrons for an electron microscope as recited in claim 15 includes providing a rounded shell containing said photoemissive cathode; a set of insulators coupled between said grounded shell and said cathode holder supporting and positioning said photoemissive cathode holder.

17. A method for generating polarized electrons for an electron microscope as recited in claim 16 includes providing a high voltage power supply providing a high voltage potential to said photoemissive cathode.

18. A method for generating polarized electrons for an electron microscope as recited in claim 16 includes providing a focusing anode extending from said grounded shell and spaced from said photoemissive cathode; a variable gap length selectively defined between said photoemissive cathode and said focusing anode allowing broad focusing tuning.

19. A method for generating polarized electrons for an electron microscope as recited in claim 12 wherein providing said external electron source using said photoemissive cathode and said low-power drive laser includes providing said photoemissive cathode with predefined cesiation of a generally planar emission surface of said photoemissive cathode, and said applied pulsed laser beam producing electrons emerging from the surface with a defined polarization or spin orientation.

* * * * *